(12) United States Patent
Ma et al.

(10) Patent No.: US 9,941,663 B2
(45) Date of Patent: Apr. 10, 2018

(54) HYBRID VERTICAL CAVITY LIGHT EMITTING SOURCES

(75) Inventors: Zhenqiang Ma, Middleton, WI (US); Weidong Zhou, Mansfield, TX (US)

(73) Assignees: Wisconsin Alumni Research Foundation, Madison, WI (US); Board of Regents, The University of Texas System, Austin, TX (US)

( * ) Notice: Subject to any disclaimer, the term of this patent is extended or adjusted under 35 U.S.C. 154(b) by 1213 days.

(21) Appl. No.: 13/474,408

(22) Filed: May 17, 2012

(65) Prior Publication Data

US 2012/0228582 A1 Sep. 13, 2012

Related U.S. Application Data

(63) Continuation of application No. 12/412,628, filed on Mar. 27, 2009, now Pat. No. 8,217,410.

(51) Int. Cl.
| | |
|---|---|
| *H01S 5/00* | (2006.01) |
| *H01S 5/183* | (2006.01) |
| *B82Y 10/00* | (2011.01) |
| *B82Y 20/00* | (2011.01) |
| *H01S 5/10* | (2006.01) |
| *H01S 5/343* | (2006.01) |

(52) U.S. Cl.
CPC ......... *H01S 5/18366* (2013.01); *B82Y 10/00* (2013.01); *B82Y 20/00* (2013.01); *H01S 5/105* (2013.01); *H01S 5/1838* (2013.01); *H01S 5/18319* (2013.01); *H01S 5/18341* (2013.01); *H01S 5/34306* (2013.01)

(58) Field of Classification Search
CPC ......... B82Y 20/00; B82Y 10/00; B82Y 15/00; B82Y 30/00; H01S 5/105; H01S 5/18319; H01S 5/18366; H01S 5/18341; H01S 5/183
USPC ........ 257/13, 89, E33.008, E33.069, E27.12
See application file for complete search history.

(56) References Cited

U.S. PATENT DOCUMENTS

| | | | | |
|---|---|---|---|---|
| 5,018,157 | A * | 5/1991 | Deppe et al. | 372/45.013 |
| 5,031,187 | A * | 7/1991 | Orenstein et al. | 372/50.11 |
| 5,358,880 | A * | 10/1994 | Lebby et al. | 438/26 |
| 6,618,414 | B1 * | 9/2003 | Wasserbauer et al. | 372/45.01 |
| 6,829,281 | B2 * | 12/2004 | Deng et al. | 372/96 |
| 6,898,215 | B2 * | 5/2005 | Naone et al. | 372/4 |
| 2002/0150135 | A1 * | 10/2002 | Naone et al. | 372/45 |
| 2005/0082545 | A1 * | 4/2005 | Wierer et al. | 257/79 |
| 2007/0057270 | A1 * | 3/2007 | Bour et al. | 257/99 |
| 2007/0105335 | A1 * | 5/2007 | Fitzgerald | 438/405 |

(Continued)

OTHER PUBLICATIONS

Yang et al., "Spectral Trimming of Fano Reflectors on Silicon and Glass substrates", 2008, IEEE Lasers & Electrooptics Society, pp. 818-819 (Dec. 2008).*

*Primary Examiner* — Nikolay Yushin
(74) *Attorney, Agent, or Firm* — Bell & Manning, LLC

(57) ABSTRACT

Vertical cavity light emitting sources that utilize patterned membranes as reflectors are provided. The vertical cavity light emitting sources have a stacked structure that includes an active region disposed between an upper reflector and a lower reflector. The active region, upper reflector and lower reflector can be fabricated from single or multi-layered thin films of solid states materials ("membranes") that can be separately processed and then stacked to form a vertical cavity light emitting source.

18 Claims, 13 Drawing Sheets

(56) References Cited

U.S. PATENT DOCUMENTS

2007/0201526 A1* 8/2007 Hori .................. 372/50.124
2012/0008658 A1* 1/2012 Chung ................ 372/45.01

* cited by examiner (a)

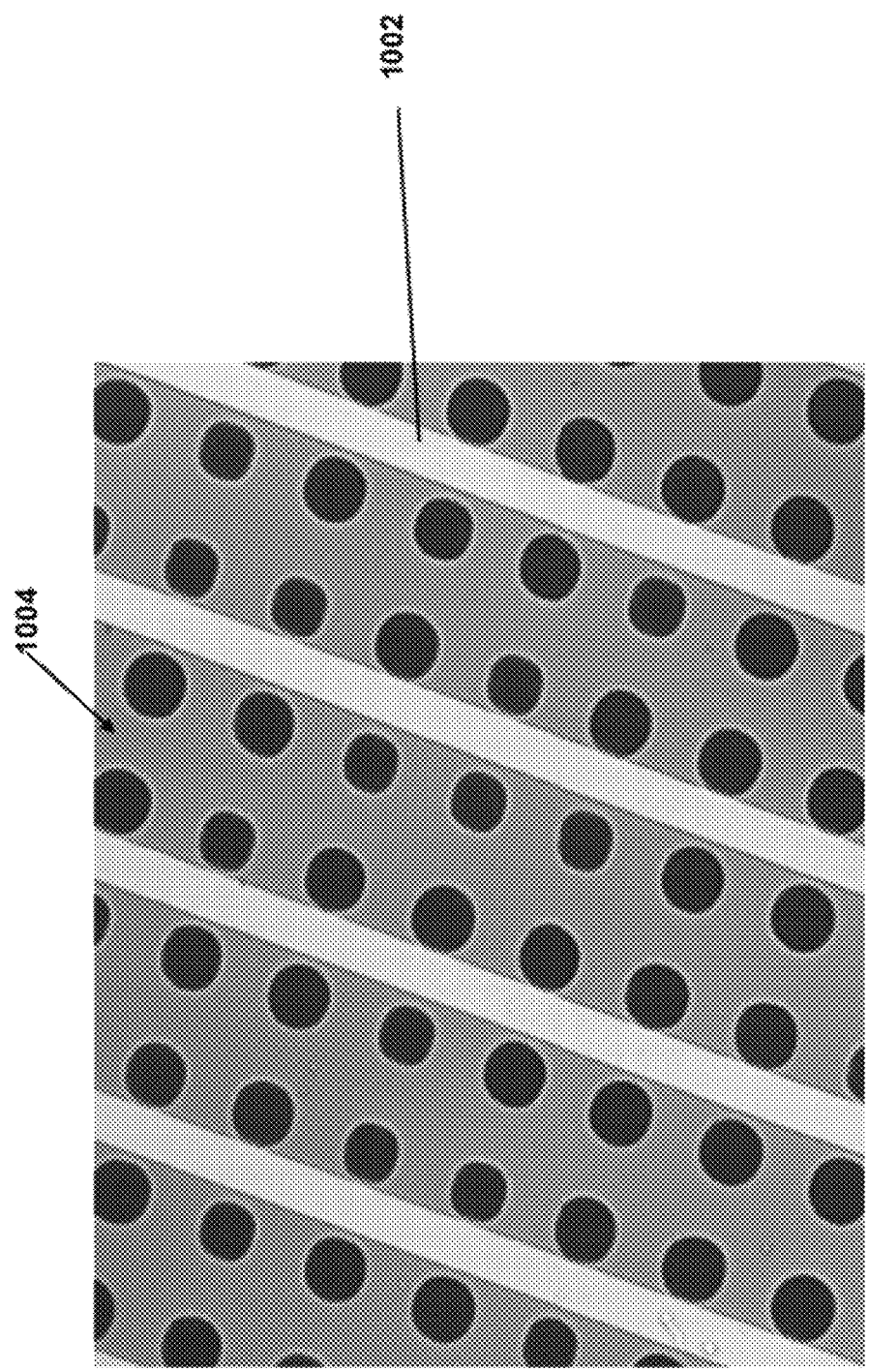

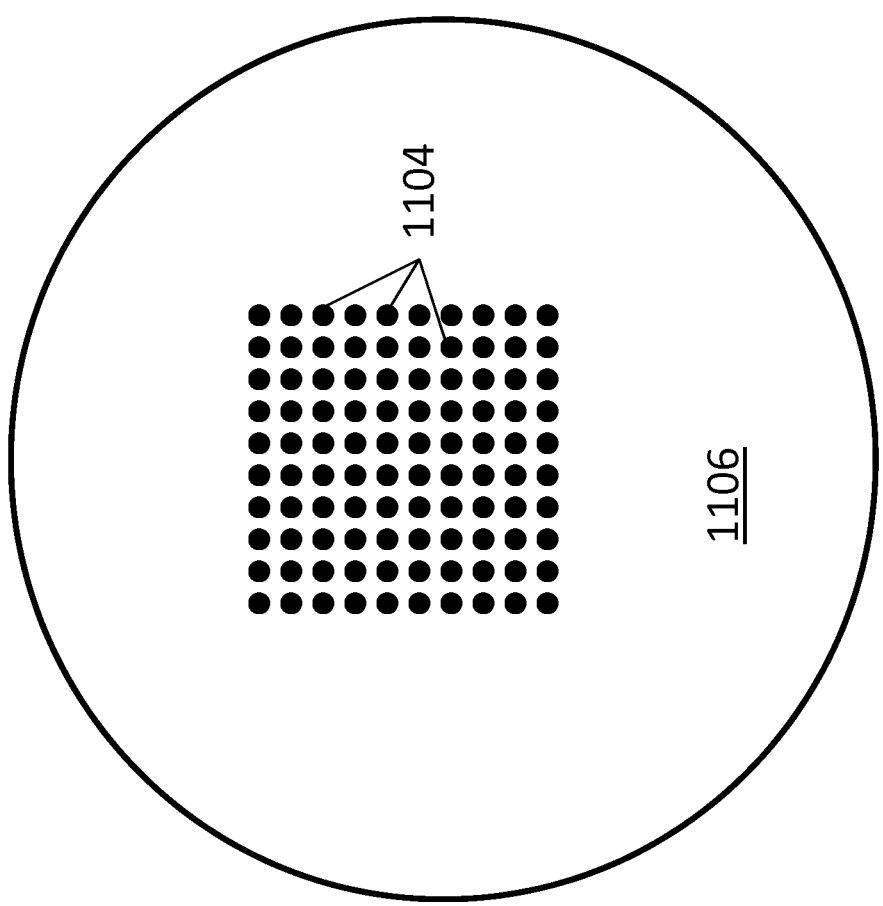

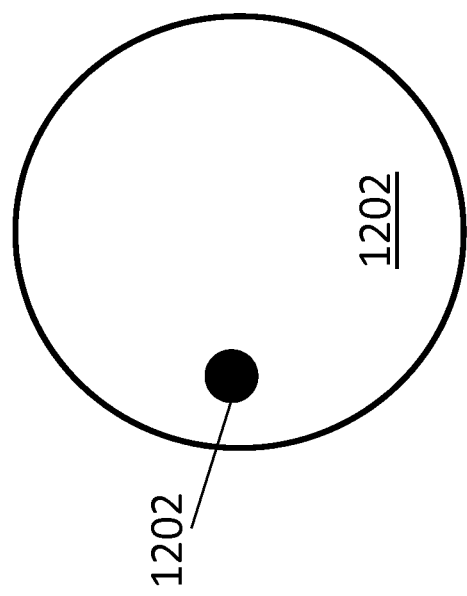

HYBRID VERTICAL CAVITY LIGHT EMITTING SOURCES

CROSS-REFERENCE TO RELATED APPLICATIONS

The present application is a continuation of U.S. patent application Ser. No. 12/412,628 that was filed Mar. 27, 2009, the entire contents of which are hereby incorporated by reference.

REFERENCE TO GOVERNMENT RIGHTS

This invention was made with government support under W911NF-04-1-0429 awarded by the ARMY/ARO. The government has certain rights in the invention.

FIELD OF THE INVENTION

The present invention relates to the field of light emitting devices. In particular, it relates to a hybrid vertical cavity light sources, such as vertical cavity surface emitting lasers (VCSELs), based on stacked semiconductor membranes and Fano resonance based reflectors.

BACKGROUND

There is a need to improve the interconnectivity between the photonics domain and the electronics domain in order to effectively integrate multi-functional photonic/electronic systems. However, the mismatch in physical scaling between photonic components and electronic components presents a significant challenge to the high density integration of photonics and silicon-compatible optoelectronics. One of the most challenging technical barriers to the development of photonics on silicon is the lack of a practical silicon-integrated light source which is (a) highly efficient; (b) ultra-compact; (c) electrically controllable; (d) CMOS process/integration compatible; and (e) reliable.

Vertical-cavity light emitting sources, including light emitting diodes and lasers could be ideal compact light sources for large-scale silicon-based photonics if they could be directly built on a silicon wafer because vertical cavity light emitting sources: (1) can be wafer-scale fabricated and probed; (2) can be fabricated in high-density 2D arrays; and (3) have low diffraction output beams for efficient coupling. However, conventional vertical-cavity light emitting source technology utilizes thick distributed-Bragg reflector (DBR) mirrors which limit the device performance and integration density.

SUMMARY

Vertical cavity light emitting sources based on stacked membranes, arrays of the light sources and methods for making the light sources and light source arrays are provided.

One aspect of the invention provides a vertical cavity light emitting sources that includes a lower reflector comprising a first patterned membranes, an active region disposed over the lower reflector and spaced from the lower reflector by at least one electrically conductive contact; and an upper reflector comprising a second patterned membranes disposed over the active region and spaced from the active region by at least one electrically conductive contact. The patterned membrane reflectors can be structures based on Fano resonance or guided resonance effect, where in-plane guided resonances above the lightline are also strongly coupled to out-of-the-plane radiation modes due to phase matching provided by the patterned lattice structure.

The patterned membranes and active regions of the vertical cavity light emitting sources can be fabricated from thin layers of solid state materials (e.g., layers having a thickness of no greater than about 0.5 μm) and may omit DBRs. As such, the vertical cavity light emitting sources can be compact, having a thickness of no greater than 3 μm, as measured from the lower surface of the first patterned membrane to the upper surface of the second patterned membrane.

Because the vertical cavity light emitting sources do not rely upon an epitaxial growth method for their fabrication, the reflectors and active region may be formed from materials having a significant lattice mismatch. For example, the first patterned membrane and the second patterned membrane can be patterned into a layer comprising a Group IV semiconductor, such as silicon, and the active region can comprise a Group III-V semiconductor. As a result, the vertical cavity light emitting sources can be fabricated directly on a silicon wafer substrate, or a glass substrate, or a flexible polymer substrate, etc.

The vertical cavity light emitting sources can be tailored to emit output radiation across a range of wavelengths, including, but not limited to, wavelengths in the ultraviolet, visible, infrared and far infrared regions of the spectrum. For example, the vertical cavity light emitting sources can be tailored to emit radiation at 1.55 μm. One such vertical cavity light emitting source includes a first patterned membrane and a second patterned membrane, each patterned into a layer of silicon, and an active region comprising multiple quantum well layers comprising GaInAsP for light emission. In this embodiment, the layer of single crystalline silicon can be the silicon device layer of a silicon-on-insulator substrate.

Another aspect of the invention provides a vertical cavity light emitting source that includes a lower reflector comprising a first patterned membrane patterned into a layer of Group IV semiconductor, an active region comprising a Group III-V semiconductor disposed over the lower reflector; and an upper reflector comprising a second patterned membrane patterned into a layer of Group IV semiconductor disposed over the active region.

In one embodiment, a vertical cavity light emitting source array includes a plurality of vertical cavity light emitting sources on a silicon wafer, the vertical cavity light emitting sources comprising a lower reflector comprising a first patterned membrane, an active region disposed over the lower reflector and an upper reflector comprising a second patterned membrane disposed over the active region wherein different vertical cavity light emitting sources in the array are configured to emit light at different wavelengths.

In another embodiment, arrays of vertical cavity light emitting sources include a plurality of vertical cavity light emitting sources on a substrate, the vertical cavity light emitting sources comprising a lower reflector comprising a first patterned membrane, an active region disposed over the lower reflector and spaced from the lower reflector by at least one electrically conductive contact, and an upper reflector comprising a second patterned membrane disposed over the active region and spaced from the active region by at least one electrically conductive contact. Within such an array, different vertical cavity light emitting sources in the array can be configured to emit light at different wavelengths. The substrate for the array may be a silicon substrate, such as a silicon wafer.

The active region, upper reflector and lower reflector can be fabricated from single or multi-layered thin films of solid state materials ("membranes"), such as semiconductors or dielectrics, which can be separately processed and then stacked to form a vertical cavity light emitting source. Thus, in one basic embodiment, a method for making a vertical cavity light emitting source includes bonding an active region to a lower reflector comprising a first patterned membrane and bonding an upper reflector comprising a second patterned membrane to the active region. The bonding between the lower reflector and the active region and the bonding between the active region and the upper reflector can take place through intra-cavity contacts that separate the reflectors from the active region.

BRIEF DESCRIPTION OF THE DRAWINGS

FIG. 2 (b) shows a cross-sectional view of another embodiment of a vertical cavity light emitting.

FIG. 7 (b) shows the measured spectral widths for the silicon membrane broadband reflector of Example 2 as a function of the etching time for the underlying buried oxide layer.

FIG. 8 (b) shows the measured spectral widths for the silicon membrane broadband reflector of Example 2 as a function of the thickness of a silicon oxide buffer layer deposited on the silicon membrane.

FIG. 10 shows an SEM image of an InP membrane having a metal frame support transferred onto a glass substrate.

FIG. 11 is a schematic illustration of an array that includes a plurality of vertical cavity light emitting sources on a substrate.

FIG. 12 depicts a top view of a vertical cavity light emitting source comprising an interconnect metal on the upper surface of a top patterned membrane.

DETAILED DESCRIPTION

Vertical cavity light emitting sources that utilize patterned membranes as reflectors are provided. The vertical cavity light emitting sources have a stacked structure that includes an active region disposed between an upper reflector and a lower reflector. The active region, upper reflector and lower reflector can be fabricated from single or multi-layered thin films of solid state materials, such as semiconductors or dielectrics, which can be separately processed and then stacked to form a vertical cavity light emitting source. For the purpose of this disclosure, these thin films will be referred to as "membranes".

The use of patterned membranes as reflectors makes it possible to eliminate DBRs from the vertical cavity light emitting source structure, which dramatically reduces the form factor of the vertical cavity light emitting sources and facilitates high density vertical cavity light emitting source array fabrication on a single substrate. In addition, by tailoring the structural parameters of the patterned membranes, different vertical cavity light emitting sources in an array can be tailored to produce different output radiation wavelengths from the ultraviolet (UV) through far infrared (IR).

The membrane stacking approach makes it possible to fabricate the vertical cavity light emitting sources directly on substrates with which they are not typically considered compatible. Thus, the vertical cavity light emitting sources can be monolithically (heterogeneously) integrated with a variety of substrates, including silicon wafers. In particular, the stacking approach eliminates the lattice-mismatch concerns that present an obstacle to more conventional integration schemes. As a result vertical cavity light emitting sources based on, for example, Group III-V semiconductors can be provided on silicon substrates. In addition, the stacking approach makes it possible to place electrical contacts between the active region and the reflectors of the vertical cavity light emitting sources ("intra-cavity contacts"), such that the reflectors are spaced from the active region by the electrical contacts. This design minimizes the surface state impact from the reflector/active region interfaces since there is no current flow between the stacked surfaces. Thus, an intra-cavity electrical contact design facilitates efficient electrical injection.

The process for fabricating a stacked membrane vertical cavity light emitting source is based on the stacking and bonding of the reflectors and active region that make up the vertical cavity light emitting source, wherein the reflectors and active region can be fabricated from membranes on separate substrates, released from those substrates, aligned, stacked and bonded. The stacking and bonding processes used to fabricate the vertical cavity light emitting sources can be carried out at low temperatures (e.g., about 350° C., or lower), rendering the processes compatible with back-end processed Si CMOS chips.

Figure 1:
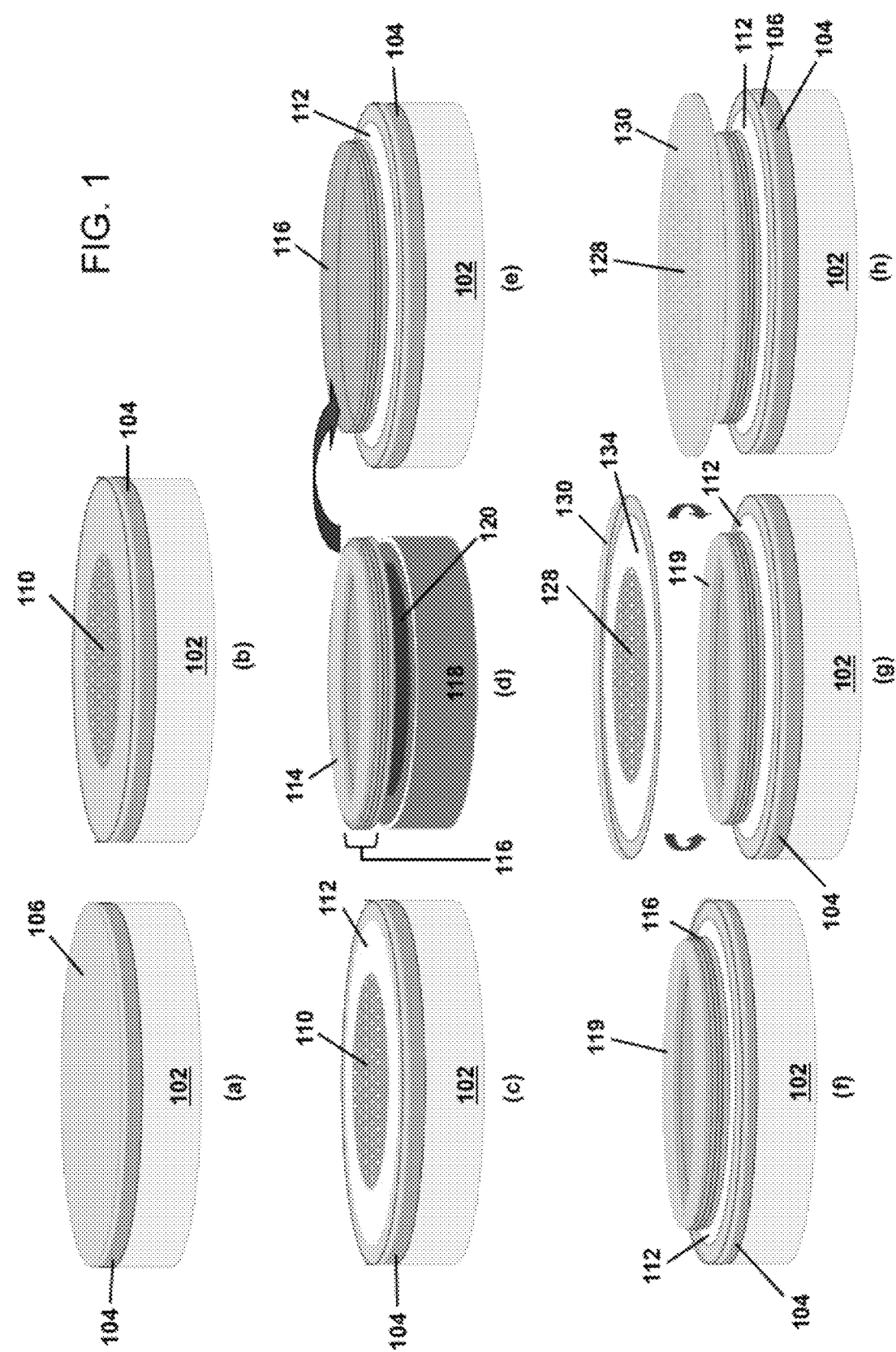
FIG. 1 is a schematic diagram illustrating a method for fabricating a vertical cavity light emitting source with patterned membrane reflectors.
Figure 2:
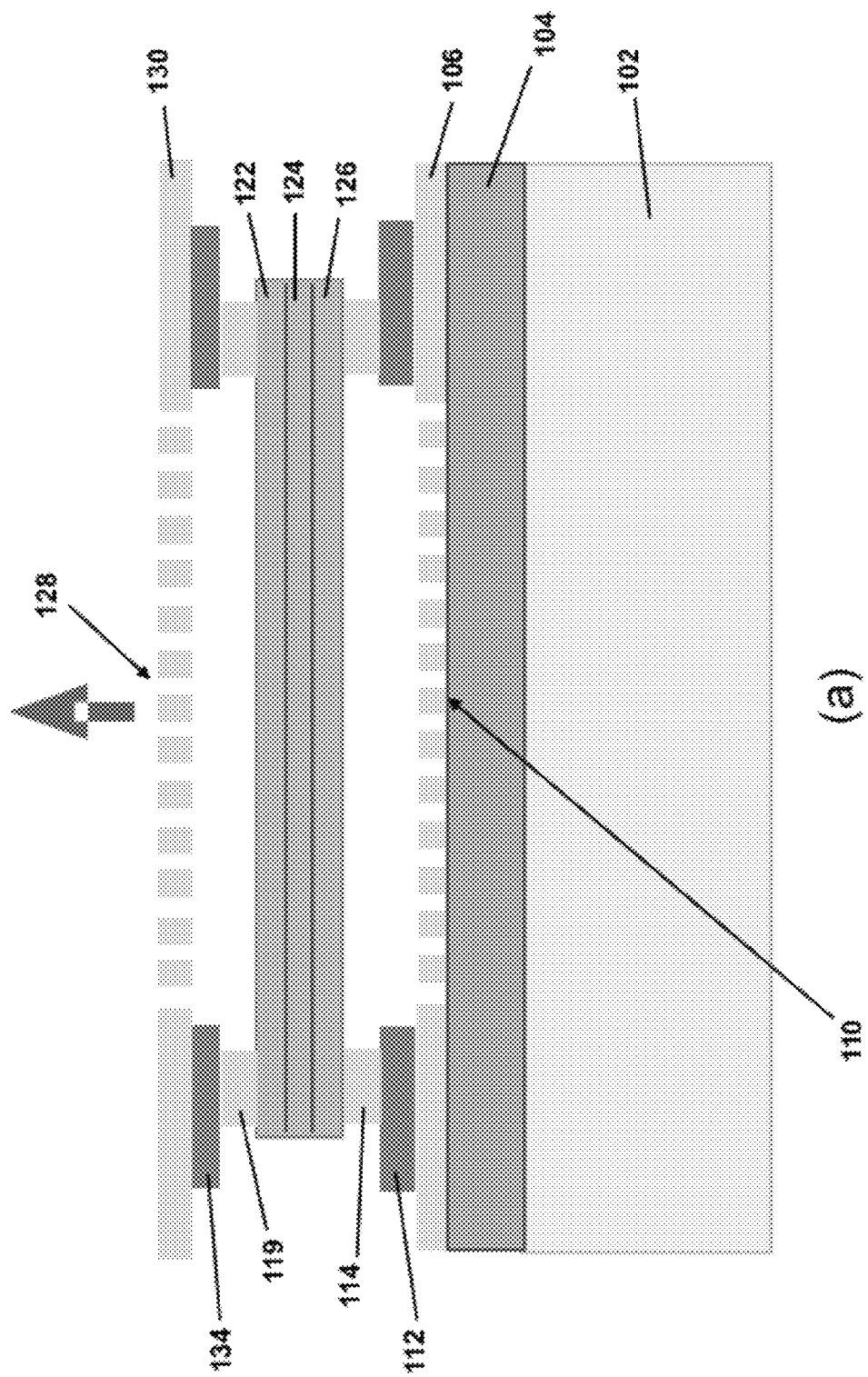
FIG. 2 (a) shows a cross-sectional view of the vertical cavity light emitting source of FIG. 1.
Figure 2:
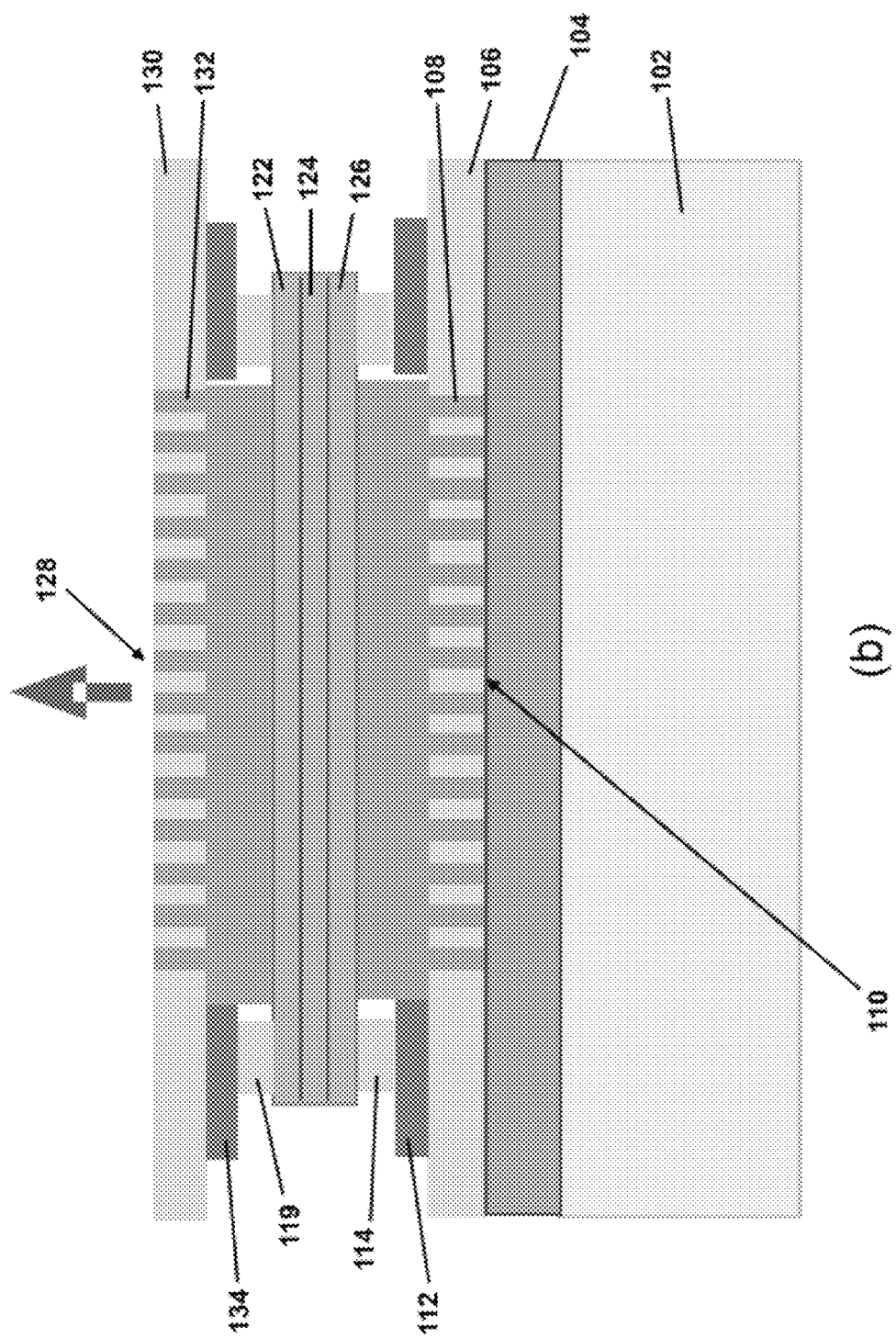

A process for fabricating a stacked membrane vertical cavity light emitting source is illustrated in detail in FIG. 1, panels (a) through (h). Cross-sectional views of two embodiments of the resulting vertical cavity light emitting source are shown in FIGS. 2(a) and 2(b). Panels (a) through (c) of FIG. 1 illustrate the fabrication of a lower reflector on a first substrate. In panel (a), the substrate is a silicon-on-insulator (SOI) substrate that includes an underlying silicon handle wafer 102, a sacrificial buried silicon oxide (BOX) layer 104 and a thin silicon device layer 106. A first patterned reflector 110 is then patterned into the silicon device layer 106. The pattern defined in the patterned reflector may vary, but generally includes an array of holes extending into or through the silicon device layer. Optionally, a thin silicon oxide layer 108 can be grown, or otherwise disposed on, the silicon device layer to fill or to partially fill the holes in the patterned membrane, as illustrated in FIG. 2 (*b*). This buffer layer can be used to provide spectral trimming, as described in Example 2, below. An electrically conductive pad 112 (e.g., a metal pad) is then formed on the upper surface of the silicon device layer 106. Methods for patterning a patterned membrane (e.g., a broadband reflector) on a SOI are described in Yang et al., IEEE Lasers and Electro-Optics Society, pp. 818-819 (2008) and Yang et al., IEEE 8th Annual Conference on Nanotechnology Conference Proceedings, pp. 209-210 (2008).

In a separate sequence of steps (shown in panel (d) of FIG. 1) the active region 116 can be formed on a second substrate 118. An electrical metal contact 114 can be formed on the active region. This metal contact can serve as an ohmic contact and/or a mechanical frame that supports the active region during its release and transfer. A sacrificial layer 120 separates the active region 116 from the substrate 118, such that the active region may be released from the substrate by etching away the sacrificial layer. The released active layer can be flip transferred to, stacked on, and bonded to the lower reflector, as shown in panel (e) of FIG. 1, and an electrically conductive contact 119 can be formed over the active region. One or more layers can be designed as the sacrificial layer. For example, InGaAs can be used as a sacrificial layer in a multiple layer stack containing InP. The InGaAs can be selectively etched away using wet etching techniques.

As illustrated in FIGS. 1 and 2, the membrane stacking approach to vertical cavity light emitting source formation provides a suspended active region that is spaced from the lower reflector by at least one intra-cavity electrically conductive contact 114. A description of methods for releasing and transferring processed semiconductor membranes can be found in U.S. Pat. No. 7,354,809. For purposes of illustration, the active region 116 in FIGS. 1 and 2 is an InP-based p-i-n laser cavity that includes an upper p-type InP cladding and contact layer 122, an InGaAsP quantum well active region 124 and a lower n-type InP cladding and contact layer 126. A more detailed description of one embodiment of an active region is provided in Example 3.

Panels (g) through (h) of FIG. 1 illustrate the method of fabricating the upper reflector of the vertical cavity light emitting source. In this method, a second patterned membrane 128 is patterned into a silicon device layer 130. Optionally, a silicon oxide buffer layer 132 can be grown, or otherwise disposed on, the silicon device layer to fill or to partially fill the holes in the patterned membrane, as illustrated in FIG. 2 (*b*). This buffer layer can be used to provide spectral trimming, as described in Example 2, below. An electrically conductive pad 134 is then formed on the surface of the silicon device layer. Initially, the patterned membrane can be disposed on a sacrificial layer that is supported by an underlying handle wafer (not shown). For example, the patterned membrane can be patterned into the silicon device layer of an SOI, as illustrated in panels (a) and (b). After the patterned membrane is fabricated, the sacrificial layer can be etched away, thereby releasing the patterned membrane 128 from the handle wafer. The released patterned membrane is then transferred from the substrate wafer and stacked and bonded onto the active region 116 of the vertical cavity light emitting source, as shown in panels (g) and (h). As illustrated in FIGS. 1 and 2, the membrane stacking approach to vertical cavity light emitting source formation provides an upper reflector that is spaced from the active region by at least one intra-cavity electrically conductive contact 119.

The first and second patterned membranes of the vertical cavity light emitting source can be formed from solid state materials (e.g., crystalline semiconductor or dielectric materials) with suitable refractive indices and optical transparency for the output wavelengths of interest. The patterned membranes are typically quite thin having a thickness of, for example, 0.5 µm. The patterned membranes are defined by an array of holes (i.e., cavities and apertures or similar structures) formed in a membrane. The patterned membranes can be designed to reflect photons of an appropriate wavelength through the active region of the vertical cavity light emitting source, in order to enhance the gain of the laser. The wavelengths and bandwidths of light reflected by the patterned membranes will depend on the characteristics of the crystals, including the material from which the patterned membranes are made, the thickness of the patterned membranes, and the dimensions, shapes, angles and spacing (lattice constants) of the cavities or apertures that define the patterned membranes. Thus, by tailoring the characteristics of the first and second patterned membranes, the present vertical cavity light emitting sources can be designed to emit output radiation across a broad range of wavelengths, including wavelengths spanning the UV, visible, IR and/or far-IR regions of the electromagnetic spectrum. Moreover, in situ wavelength tunability is also achievable through in situ resonance control via, e.g., thermal or carrier induced index tuning of the patterned membranes. In some embodiments, the first and second patterned membranes provide broadband reflection via guided mode resonances or Fano resonances which couple surface normal continuum radiation modes with discrete in-plane modes. Examples 1 and 2, describe the fabrication, release and transfer of a broadband reflector patterned membrane patterned into a silicon membrane.

In the embodiments of the vertical cavity light emitting sources, the patterned membranes can replace the conventional DBRs in order to provide an ultracompact laser structure. Thus, the present vertical cavity light emitting sources can have a total thickness of 3 µm or less, 2 µm or less, or 1 µm or less, depending on the device operation wavelengths and the device structures.

The active region may include any suitable gain medium that emits light in response to current injection, electrical pumping or optical pumping and that can be stacked in accordance with the vertical cavity light emitting source structures described herein. For example, the active region may include a III-V semiconductor-based gain medium, such as an InP- or a GaAs-based gain medium. Alternatively, the active region may include a II-VI semiconductor-based gain medium. A typical active region includes one or more light-emitting quantum well layers sandwiched between cladding layers. In some embodiments, the active region will have a p-i-n structure wherein the quantum well includes a layer of intrinsic semiconductor material sandwiched between a p-type semiconductor layer and an n-type semiconductor layer. Specific examples of active region cladding and quantum well materials include, but are not limited to, InGaN/GaN, (Al)GaInP/GaP, (Al)GaInAs/GaAs, GaInAs/InP, and (Al)GaInAsSb/GaSb. InGaAs/InP-based quantum well (QW) structures are of particular interest in photonic applications since they enable device operation in the 1.3 µm to 1.55 µm wavelength range which is of importance for optical communication systems.

The characteristics of the light generated by the gain medium will depend on the nature of the materials used in the active region. Therefore, depending on the particular active region materials employed and upon the reflective properties of the patterned membranes, the present vertical cavity light emitting sources can be designed to generate output radiation from the UV through the far IR regions of the spectrum. For example, the vertical cavity light emitting sources can generate output radiation at wavelengths from about 0.3 µm to about 7 µm. Although, wavelengths outside of this range are also accessible.

The electrically conductive pads and contacts in the vertical cavity light emitting source can be made of any suitable electrically conductive materials, such as metals or transparent electrically conductive materials. Although the embodiment shown in FIG. 2 includes only a single ring-shaped contact between the lower reflector and the active region and between the active region and the upper reflector, other contact designs and geometries may be employed. For example, the active region and the upper reflector may each be suspended by multiple intra-cavity electrically conductive contacts. In addition, as shown in FIG. 12, if semiconductors (e.g., single crystal silicon) are used for the top patterned membrane, they can be selectively doped to allow interconnect metals 1202 to be built on the top of the membrane 1204.

Optionally, the vertical cavity light emitting source can include at least one flexible electrically conductive contact between the lower reflector and the active region and/or between the active region and the upper reflector. Such a design compensates for the stress due to any thermal-mismatch between the materials of the active region and the materials of the reflectors. Also optionally, a local thermo-electronic control (TEC heatsink) unit can be integrated into one of more of the contacts to facilitate thermal dissipation from the active region and precise wavelength control.

Arrays of vertical cavity light emitting sources are also provided. As shown in the array illustrated in FIG. 11, the arrays include a plurality of vertical cavity light emitting sources 1104 on a substrate 1106. Using the method of fabrication illustrated in FIG. 1, a plurality of vertical cavity light emitting sources can be fabricated in an array on a single substrate. The arrays can include, for example, at least 100 vertical cavity light emitting sources on a single substrate. This includes embodiments in which an array includes at least 1000 vertical cavity light emitting sources on a single substrate. In some embodiments the substrate is a silicon wafer. The vertical cavity light emitting sources in a given array may be designed to emit output radiation having the same wavelength and bandwidth characteristics. Alternatively, individual vertical cavity light emitting sources in a given array may be designed to emit output radiation having wavelength and bandwidth characteristics that differ from those of other vertical cavity light emitting sources in the array. This can be accomplished by including vertical cavity light emitting sources with different active region materials and/or vertical cavity light emitting sources with different patterned membrane geometries in the array. Laser arrays that include vertical cavity light emitting sources that emit output radiation from the UV through the far IR can be fabricated. For example, a laser array can include a plurality of vertical cavity light emitting sources on a substrate, wherein the upper and lower reflectors for at least one vertical cavity light emitting source have a reflectance spectrum that differs from the reflectance spectrum of the upper and lower reflectors for at least one other vertical cavity light emitting source in the array. In addition (or in the alternative) a laser array can include a plurality of vertical cavity light emitting sources on a substrate, wherein the active region for at least one vertical cavity light emitting source comprises a gain medium that differs from the gain medium of at least one other vertical cavity light emitting source in the array. In one embodiment of the latter vertical cavity light emitting source array design, the active region of the vertical cavity light emitting sources may include cladding and quantum well materials that are independently selected from the group consisting of InGaN/GaN, (Al)GaInP/GaP, (Al)GaInAs/GaAs, GaInAs/InP, and (Al)GaInAsSb/GaSb.

EXAMPLES

Example 1

Figure 3:
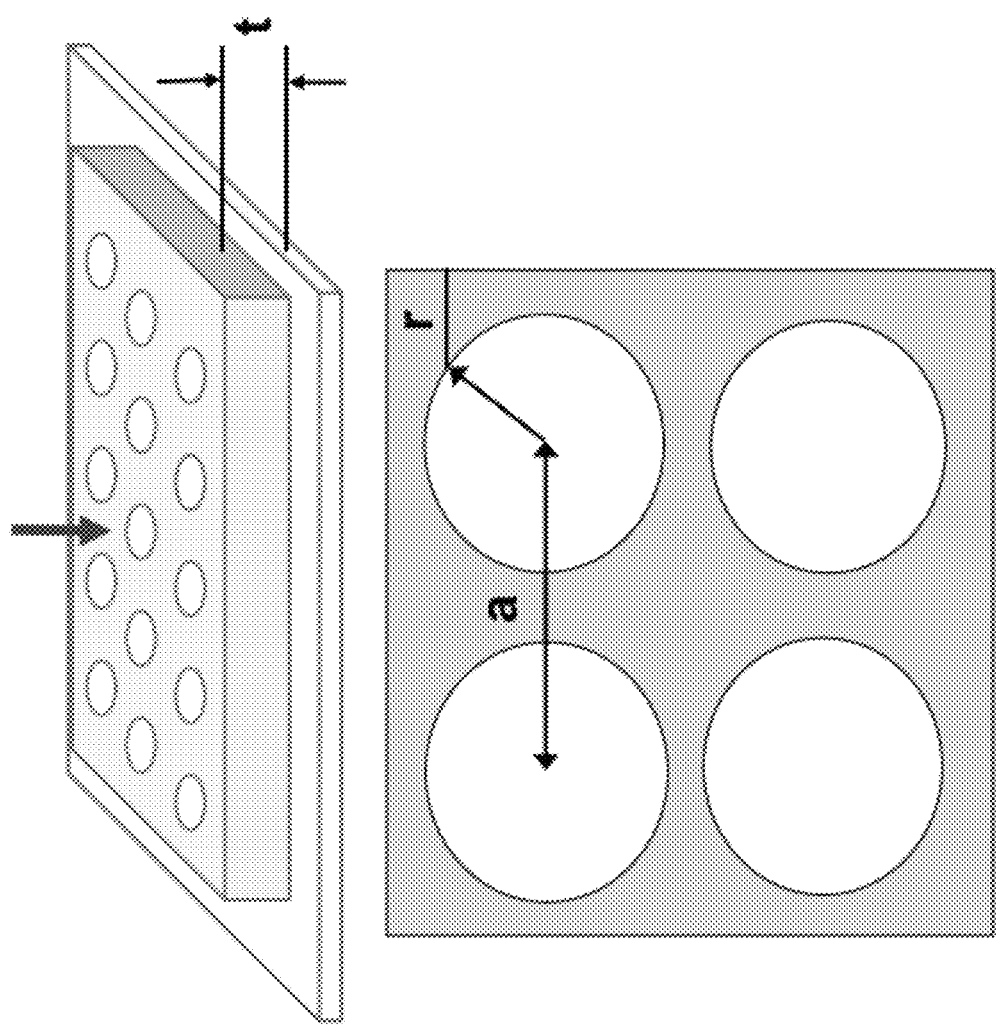
FIG. 3 shows a schematic diagram of a silicon membrane broadband reflector on a glass substrate.

The following example demonstrates the fabrication of a patterned membrane broadband reflector, based on a single crystalline membrane transferred to a glass substrate, as shown schematically in FIG. 3. The patterned photonic structure was designed using a three-dimensional finite-difference time domain (3D FDTD) technique (see Qiang et al., Proc. SPIE, vol. 6901, 69010F, 2008), and fabricated with a target operating wavelength of 1550 nm. The high-quality, large area uniform pattern was verified with a diffraction pattern measurement where well-defined diffraction patterns were measured with either a continuous wave (cw) green laser source or a focused broadband QTH (Quartz-Tungsten-Halogen) lamp source. The design parameters for the broadband reflector structure were as follows: (a) lattice constant a of 900 nm; (b) air hole radius r of 234 nm; and (c) membrane thickness t of 340 nm. The structure was fabricated on silicon-on-insulator (SOI) wafers using e-beam lithography and plasma dry-etching processes.

The patterned silicon membrane was released from the handle wafer of the SOI by etching the buried oxide layer with HF. The released membrane was then transferred to a glass substrate.

Figure 4:
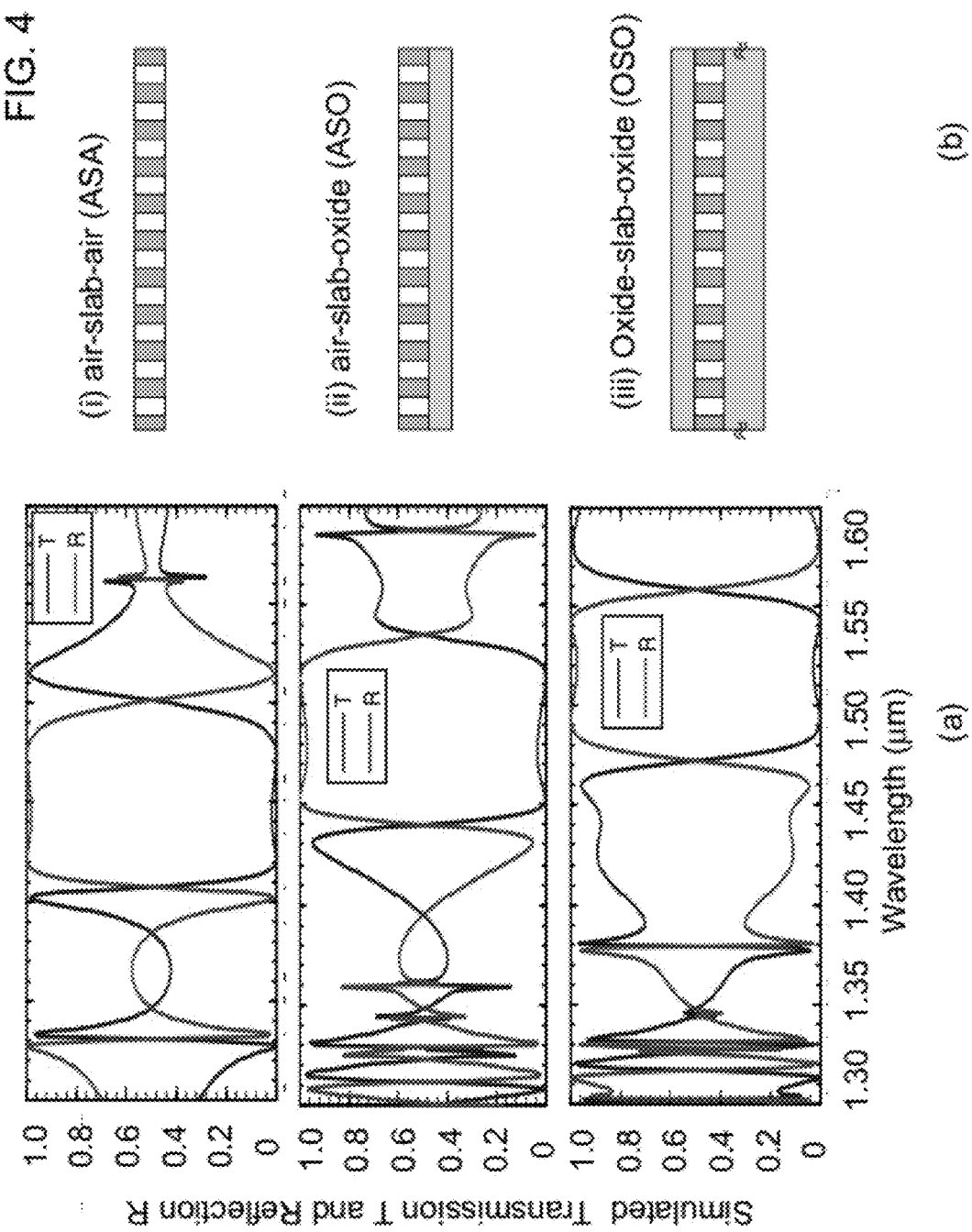
FIG. 4 shows the simulated broadband reflector transmission (T) and reflection (R) spectra for three different slab configurations for the broadband reflector of Example 1.
Figure 5:
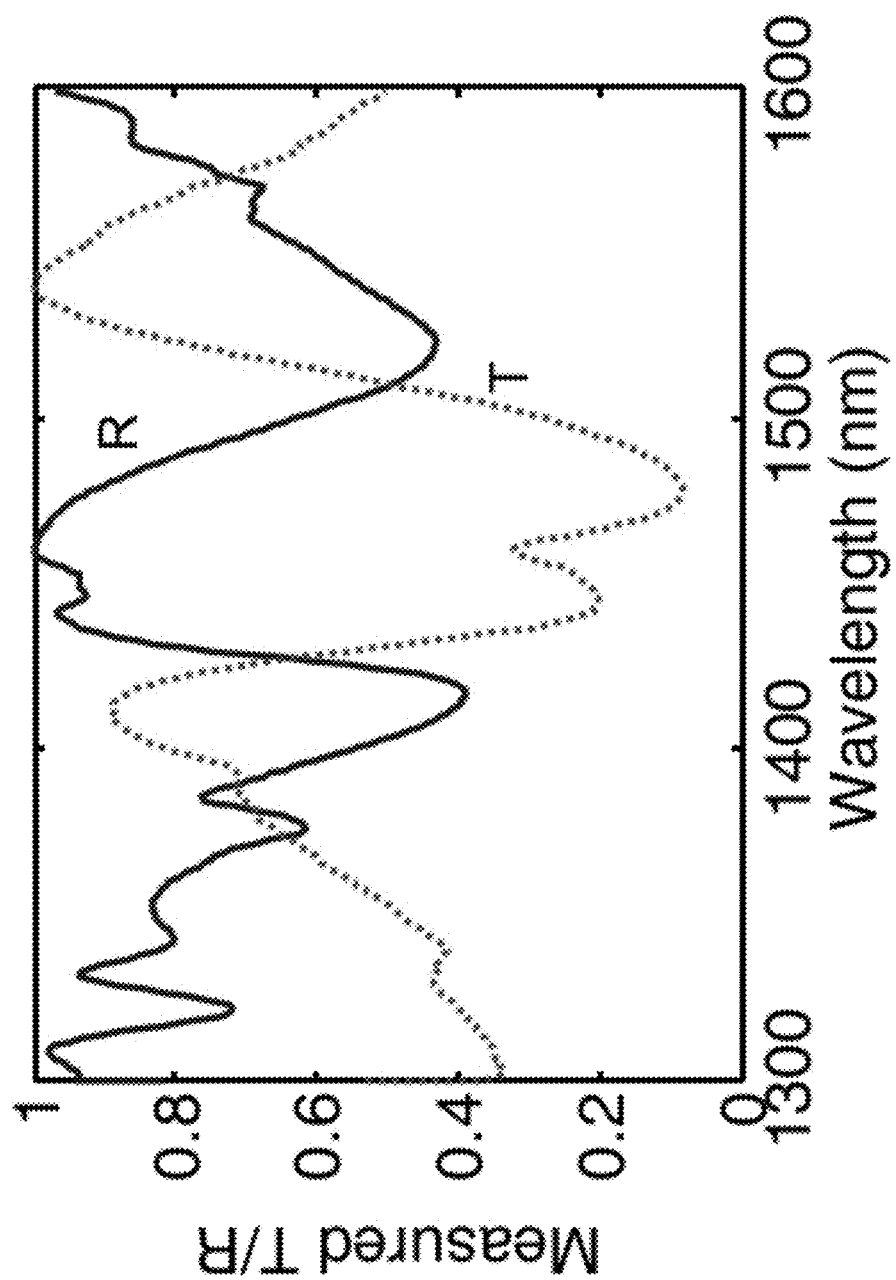
FIG. 5 shows the measured transmission (T) and reflection (R) spectra for the silicon membrane broadband reflector of Example 1.
Figure 6:
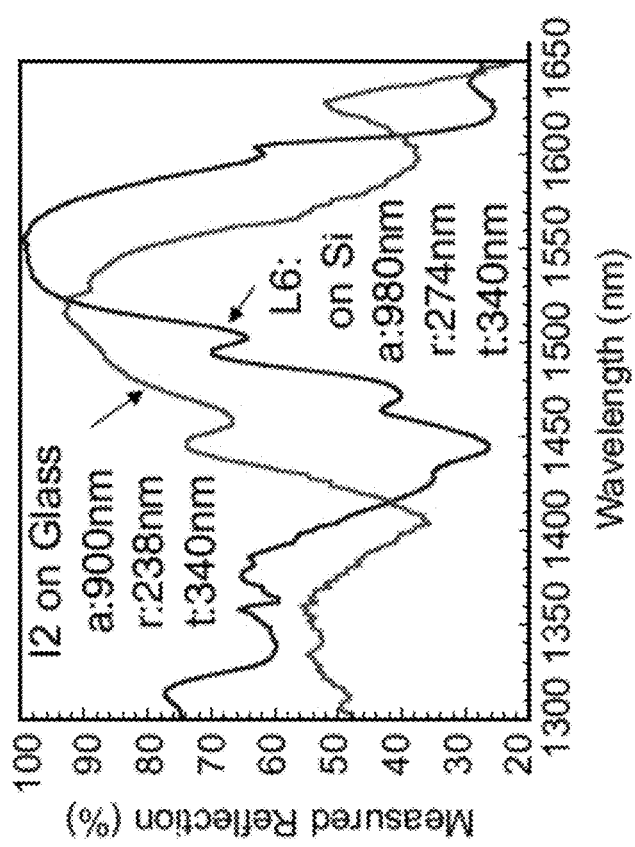
FIG. 6 shows the measured transmission (T) and reflection (R) spectra for the silicon membrane broadband reflector of Example 2 on SOI.

Shown in FIG. 4 are the simulated broadband reflector transmission and reflection characteristics for the broadband reflector with three different slab configurations for vertical confinement ((i) suspended air membrane structure with air-slab-air (ASA) configuration; (ii) air-slab-oxide (ASO) configuration, and (iii) silicon membrane embedded in the oxide region with oxide-slab-oxide (OSO) configuration). Measured transmission and reflection results for the broadband reflector are shown in FIG. 5. These measurements were taken prior to the release of the patterned silicon membrane from the SOI substrate. As shown in FIGS. 4 and 5, broadband reflection can be achieved with proper optimization of the patterned membrane structural parameters.

Example 2

This Example demonstrates another broadband reflector fabricated on an SOI and subsequently transferred to a glass substrate. This example further demonstrates the use of spectral trimming for the precise definition of lasing cavity resonances, based on index control using a low index oxide material in contact with the silicon membrane broadband reflector. The design of the patterned structure was based on finite difference time-domain (FDTD) and coupled-wave analysis (RCWA) techniques. The structure was first fabricated on silicon-on-insulator (SOI) wafers using e-beam lithography and plasma dry-etching processes. Once formed, the silicon membrane broadband reflector was released from the handle wafer of an SOI by etching away the buried oxide layer. The released membrane was then transferred to a glass substrate. The uniform pattern was verified with a diffraction pattern measurement. The measured broadband reflection spectra for the broadband reflector on the SOI and on the glass substrate are shown in FIG.

6. The design parameters for the broadband reflector structure on SOI were as follows: (a) lattice constant a of 900 nm; (b) air hole radius r of 238 nm; and (c) membrane thickness t of 340 nm. The design parameters for the broadband reflector structure on glass were as follows: (a) lattice constant a of 980 nm; (b) air hole radius r of 274 nm; and (c) membrane thickness t of 340 nm.

Figure 7:
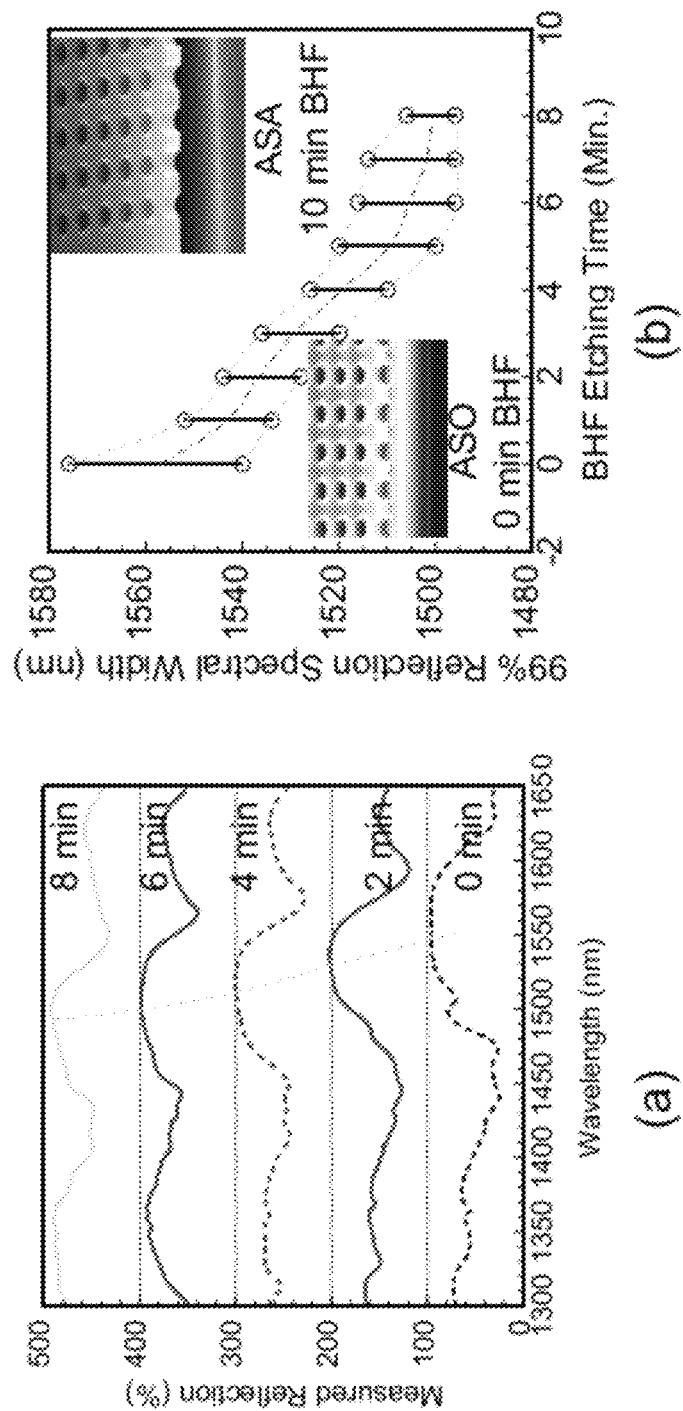
FIG. 7 (a) shows the measured reflection spectra for the silicon membrane broadband reflector of Example 2 as a function of the etching time for the underlying buried oxide layer.

Spectral trimming was accomplished by the controlled partial etching of the buried $SiO_2$ layer of the SOI. Partial etching for different periods of time provided different effective indices for the buried oxide layer, which resulting in a controlled spectral shift (blue-shift). The measured broadband reflection results are shown in FIGS. 7 (*a*) and (*b*) for different etching times.

Figure 8:
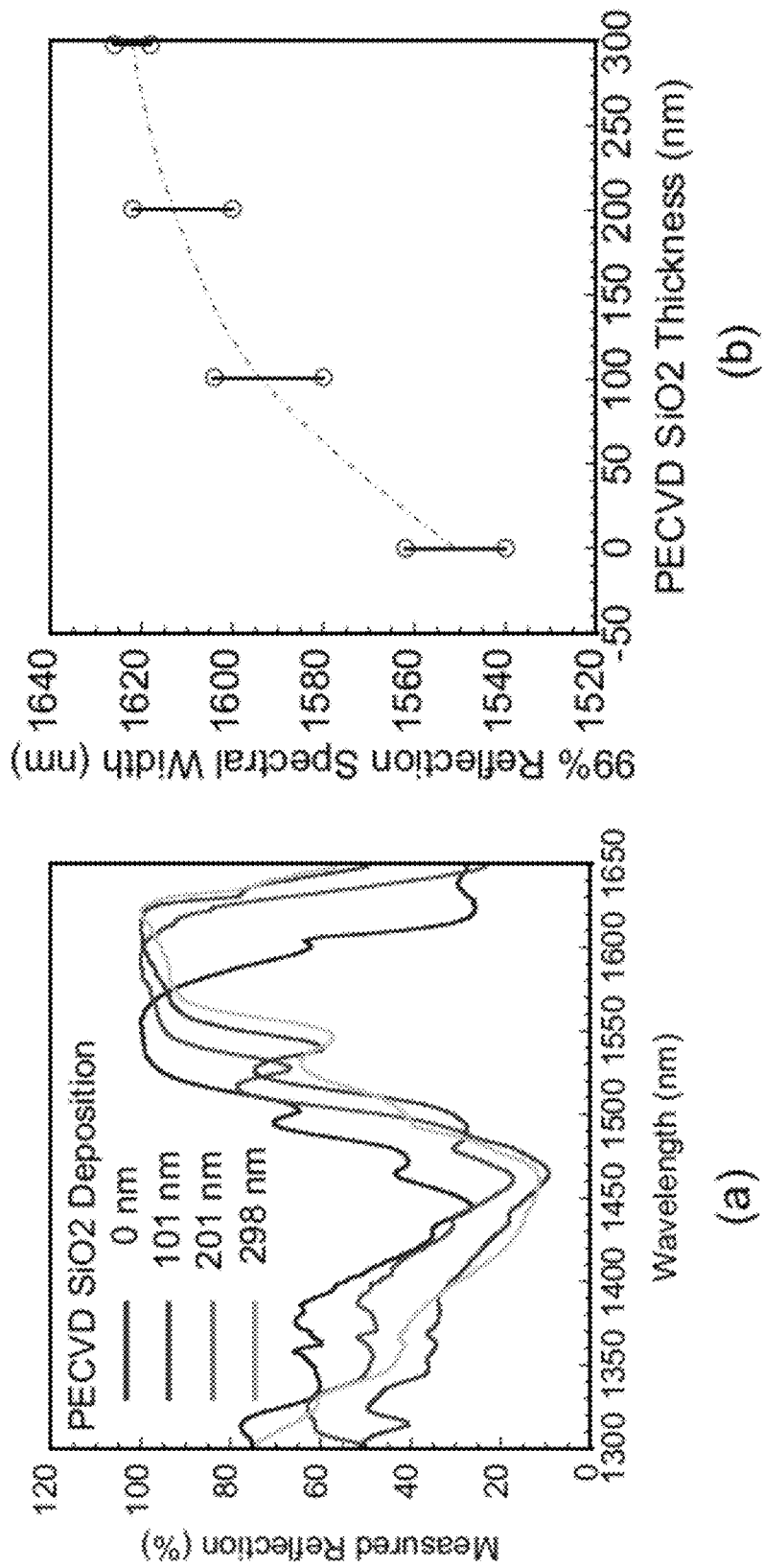
FIG. 8 (a) shows the measured reflection spectra for the silicon membrane broadband reflector of Example 2 as a function of the thickness of a silicon oxide buffer layer deposited on the silicon membrane.
Figure 9:
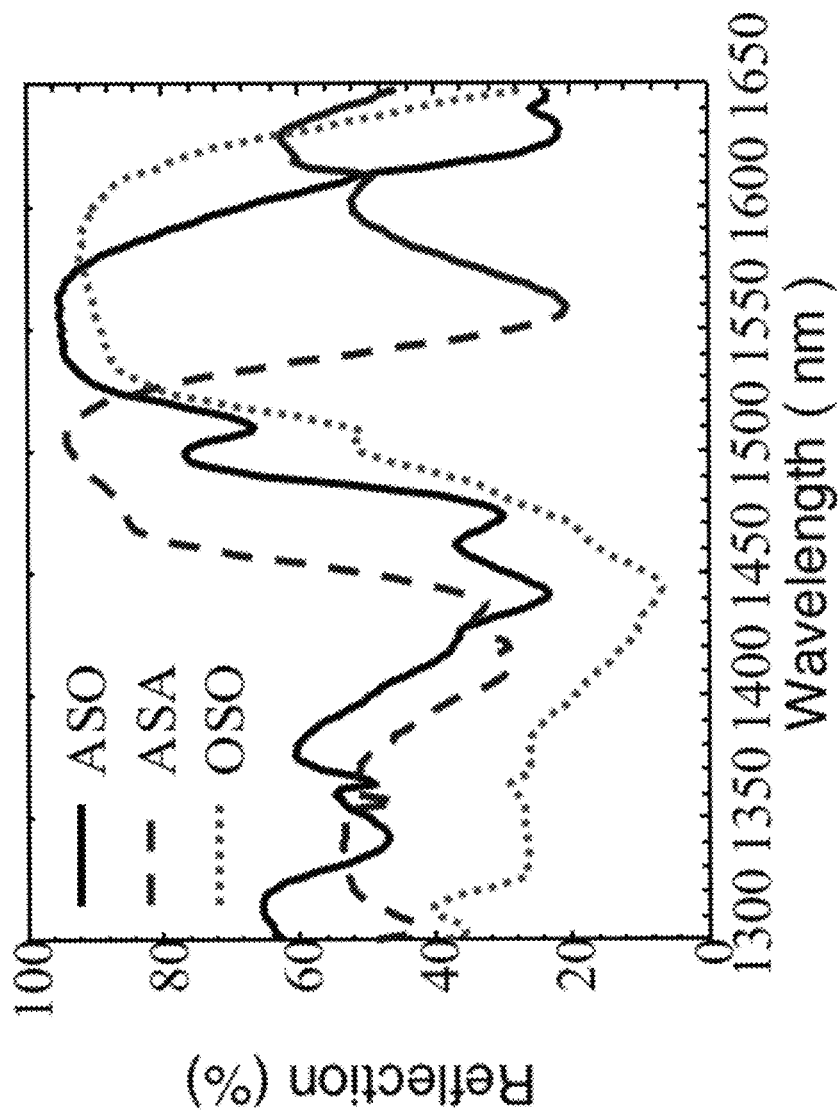
FIG. 9 shows the measured reflection (R) spectra for three different slab configurations for the broadband reflector of Example 2.

Spectral trimming (red-shift) can also be accomplished with the addition of an oxide layer in contact with the silicon membrane broadband reflector. Such a layer can be grown, for example, by PECVD deposition of an oxide on top of the silicon membrane or by spin-on-glass (SOG) backfilling of the air region above, below, and/or in the cavities of the patterned membrane. The measured broadband reflection results are shown in FIGS. 8 (*a*) and (*b*) for different thicknesses of a PECVD-grown silicon oxide buffer layer. The measured reflection spectra for three different slab configurations for vertical confinement ((i) suspended air membrane structure with air-slab-air (ASA) configuration; (ii) air-slab-oxide (ASO) configuration, and (iii) silicon membrane embedded in the oxide region with oxide-slab-oxide (OSO) configuration) are shown in FIG. 9.

Example 3

This Example describes a multi-layered semiconductor structure that can be used as an active layer in a vertical cavity light emitting source. Table 1 provides a description of each layer in the structure, including the material, layer thickness, and doping characteristics. The various semiconductor layers can be grown and doped using conventional semiconductor processing techniques. As indicated in the table, the multi-layered structure can be built on an n+ type InP substrate on which a sacrificial layer of InGaAs and InP have been grown. In this particular embodiment, the active region itself includes a light-emitting region comprising multiple strain-compensated quantum wells sandwiched between pairs of spacer layers, cladding layers and doped semiconductor contact layers. The multiple quantum wells in this embodiment include well layers of $In_{0.76}Ga_{0.24}As_{0.83}P_{0.17}$ between barrier layers of $In_{0.78}Ga_{0.515}As_{0.83}P_{0.17}$. The spacer layers are layers of $In_{0.78}Ga_{0.22}As_{0.479}P_{0.521}$. The cladding layers comprise InP and the contact layers comprise heavily doped InGaAs. Once the cavity structure has been grown on the sacrificial layers, those layers can be removed via etching and the active region can be released and incorporated into a vertical cavity light emitting source.

An example of a metal frame-supported membrane is shown in FIG. 10. This supported membrane was fabricated by forming a metal (e.g., gold) frame 1002 on a semiconductor membrane 1004 (e.g., InP membrane) prior to releasing and transferring the membrane to a glass substrate. The supporting frame, shown here as a plurality of parallel bars, can be configured in different patterns and made of different materials, provided that it provides mechanical support during membrane release and transfer. In addition to mechanical support, the frame can provide electrical isolation, electrical contacts, and/or magnetic self-assembly or alignment.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

TABLE 1

| | | InGaAsP - Based Active Region | | | |
|---|---|---|---|---|---|
| Layer | Description | Material | Thickness (nm) | Dopant | Doping ($cm^{-3}$) |
| 23 | Contact layer | InGaAs | 40 | Zn | 1e19 |
| 22 | Cladding layer | InP | 50 | Zn | 2e18 |
| 21 | Spacer layer (Q1.2) | $In_{0.78}Ga_{0.22}As_{0.479}P_{0.521}$ | 78.2 | | Undoped (UID) |
| 20 | Barrier (0.9% ts) | $In_{0.485}Ga_{0.515}As_{0.83}P_{0.17}$ | 7 | | Undoped (UID) |
| 5...19 | Quantum wells (1% cs) (x8) | $In_{0.76}Ga_{0.24}As_{0.83}P_{0.17}$ | 8 | | Undoped (UID) |
| 4...18 | Barrier (0.9% ts) (x8) | $In_{0.485}Ga_{0.515}As_{0.83}P_{0.17}$ | 7 | | Undoped (UID) |
| 3 | Spacer layer (Q1.2) | $In_{0.78}Ga_{0.22}As_{0.479}P_{0.521}$ | 78.2 | | Undoped (UID) |
| 2 | Cladding layer | InP | 50 | Si | 2e18 |
| 1 | Contact layer | InGaAs | 40 | Si | 1e19 |
| | Sacrificial layer | InP | 100 | Si | 5e18 |
| | Sacrificial layer | InGaAs | 500 | Si | 5e18 |

InP Substrate (n+)

What is claimed is:

1. A vertical cavity light emitting source comprising:
   (a) a lower reflector comprising a first patterned membrane comprising an array of holes patterned into a layer of semiconductor;
   (b) an active region disposed over the lower reflector, wherein the active region is separated from the lower reflector by at least one intra-cavity electrically conductive metal contact disposed between an outermost surface of the active region and the lower reflector, and further wherein the active region comprises a light-emitting region, a first cladding layer, a second cladding layer, a first contact layer comprising a doped semiconductor and a second contact layer comprising a doped semiconductor, wherein the light-emitting region is between the first and second cladding layers and the first and second cladding layers are between the first and second contact layers; and
   (c) an upper reflector comprising a second patterned membrane comprising an array of holes patterned into a layer of semiconductor disposed over the active region, wherein the upper reflector is separated from the active region by at least one intra-cavity electrically conductive metal contact disposed between the upper reflector and an outermost surface of the active region.

2. The light emitting source of claim 1, wherein the layer of semiconductor of the first patterned membrane and the layer of semiconductor of the second patterned membrane have thicknesses no greater than about 0.5 μm.

3. The light emitting source of claim 1, wherein the first and second patterned membranes are silicon membranes and the holes in one or both of the first and second patterned membranes are at least partially filled with silicon oxide.

4. The light emitting source of claim 1 having a thickness of no greater than 3 μm, as measured from a lower surface of the first patterned membrane to an upper surface of the second patterned membrane.

5. The light emitting source of claim 1, wherein at least one of the lower reflector and the upper reflector include a spectral trimming layer in contact with the first patterned membrane or the second patterned membrane.

6. The light emitting source of claim 1, wherein the first patterned membrane and the second patterned membrane are each patterned into a layer of single crystalline silicon and the active region comprises multiple quantum well layers of GaInAsP sandwiched between a first cladding layer of n-type InP and a second cladding layer of p-type InP.

7. The light emitting source of claim 1, wherein the second patterned membrane is selectively doped and the light emitting source further comprises an interconnect metal on the upper surface of the second patterned membrane.

8. The light emitting source of claim 1, wherein the upper and lower reflectors do not include distributed Bragg reflectors.

9. The light emitting source of claim 1, wherein the first patterned membrane is patterned into a silicon device layer of a silicon-on-insulator substrate, the silicon-on-insulator substrate comprising a buried oxide layer between the silicon device layer and a handle wafer.

10. The light emitting source of claim 9, wherein the buried oxide layer of the silicon-on-insulator substrate is partially etched away.

11. The light emitting source of claim 1, wherein the first patterned membrane and the second patterned membrane are patterned into a layer of a Group IV semiconductor and the active region comprises layers of Group III-V semiconductors.

12. The light emitting source of claim 11, wherein the first patterned membrane and the second patterned membrane are each patterned into a layer of single crystalline silicon and the active region comprises at least one quantum well disposed between a first cladding layer and a second cladding layer.

13. The light emitting source of claim 12, wherein at least one quantum well layer comprises GaInAsP and the first and second cladding layers comprise InP.

14. A light emitting source array comprising a plurality of the vertical cavity light emitting sources of claim 1 on a substrate.

15. The light emitting source array of claim 14 comprising at least 100 vertical cavity light emitting sources.

16. The light emitting source array of claim 14, wherein different vertical cavity light emitting sources in the array are configured to emit light at different wavelengths.

17. The light emitting source array of claim 14, wherein the substrate is a silicon wafer.

18. The light emitting source of claim 14, wherein the substrate is a flexible polymeric substrate.

* * * * *